United States Patent [19]

Dutta et al.

[11] Patent Number: 5,412,225

[45] Date of Patent: May 2, 1995

[54] TUNABLE HEAVY AND LIGHT HOLE COUPLED BANDS IN VARIABLE-STRAIN QUANTUM WELL SEMI-CONDUCTOR HETEROSTRUCTURE FOR NOVEL OPTO-ELECTRONIC DEVICES

[75] Inventors: Mitra Dutta, Matawan; Weimin Zhou, Eatontown; Hongen Shen, Howell; Jagadeesh Pamulapati, Eatontown, all of N.J.

[73] Assignee: The United States of America as represented by the Secretary of the Army, Washington, D.C.

[21] Appl. No.: 199,043

[22] Filed: Feb. 18, 1994

[51] Int. Cl.[6] ............. H01L 27/14; H01L 31/00
[52] U.S. Cl. ........................ 257/18; 257/21; 359/248; 385/8
[58] Field of Search ........... 257/18, 21, 14, 22; 359/248; 385/8, 14

[56] References Cited

U.S. PATENT DOCUMENTS

| | | | |
|---|---|---|---|
| 4,904,859 | 2/1990 | Goossen et al. | 250/211 J |
| 4,952,792 | 8/1990 | Caridi | 250/211 J |
| 5,001,522 | 3/1991 | Takahashi et al. | 357/16 |
| 5,079,774 | 1/1992 | Mendez et al. | 372/27 |
| 5,090,790 | 2/1992 | Zucker | 257/18 |
| 5,117,469 | 5/1992 | Cheung et al. | 257/18 |
| 5,274,247 | 12/1993 | Dutta et al. | 359/248 |
| 5,313,073 | 5/1994 | Kuroda et al. | 257/18 |

OTHER PUBLICATIONS

"Biaxial and uniaxial stress in gallium arsenide on silicon: A linear polarized photoluminescence study", H. Shen et al, Journal of Applied Physics, vol. 68(1), pp. 369–371, Jul. 1, 1990.

"Polarized–cathodoluminescence study of uniaxial and biaxial stress in GaAs/Si", D. A. Rich et al, Physical Review B, The American Physical Society, vol. 43, No. 8, pp. 6836–6839, Mar. 15, 1991.

"Electric field dependence of optical absorption near the band gap of quantum-well structures", Physical Review B, The American Physical Society, vol. 32, No. 2, pp. 1043–1060, 1985.

Primary Examiner—Sara W. Crane
Attorney, Agent, or Firm—Michael Zelenka; William H. Anderson

[57] ABSTRACT

An opto-electronic semiconductor device including a variable strained layered quantum well structure having at least two superimposed heavy- and light-hole triangular bottom valance band quantum wells with mutually opposite slopes. Upon the application of a bias potential across a thickness dimension of the quantum wells, an electric field is generated therethrough which produces an interchange of the confined energy levels of heavy-holes and light-holes in the quantum wells which causes a change in the transmission characteristics of light passing through the device as a result of the heavy- and light-hole energy bands having different light absorption anisotropy.

15 Claims, 3 Drawing Sheets

TUNABLE HEAVY AND LIGHT HOLE COUPLED BANDS IN VARIABLE-STRAIN QUANTUM WELL SEMI-CONDUCTOR HETEROSTRUCTURE FOR NOVEL OPTO-ELECTRONIC DEVICES

GOVERNMENT INTEREST

The invention described herein may be manufactured, used, and licensed by or for the Government for governmental purposes without the payment to us of any royalty thereon.

FIELD OF THE INVENTION

This invention relates in general to semiconductor strain layered heterostructures and more particularly to an opto-electronic device including a variable strain layered quantum well.

BACKGROUND OF THE INVENTION

Strain layered semiconductor devices are generally known and their anisotropic characteristics and absorption have been investigated. Two publications describing these characteristics include, for example, "Biaxial and uniaxial stress in gallium arsenide on silicon: A linear polarized photoluminescence study", H. Shen et al, *Journal of Applied Physics,* Vol. 68(1), pp. 369–371, Jul. 1, 1990 and " Polarized-cathodoluminescence study of uniaxial and biaxial stress in GaAs/Si", D. A. Rich et al, *Physical Review B,* The American Physical Society, Vol. 43, No. 8, pp. 6836–6839, Mar. 15, 1991.

The effects of electric fields on the optical absorption near the band edge in GaAs/AlGaAs quantum well structures has been disclosed in a publication entitled "Electric field dependence of optical absorption near the band gap of quantum-well structures", *Physical Review B,* The American Physical Society, Vol. 32, No. 2, pp. 1043–1060.

Furthermore, an optical semiconductor device that includes a quantum well structure as the active region and exhibits a non-linear optical effect with respect to light of energy near the band gap between the allowed band edges and the active region is disclosed in U.S. Pat. No 5,001,522, entitled, "Optical Semiconductor Device", Takahashi et al, Mar. 19, 1991.

SUMMARY OF THE INVENTION

It is an object of the present invention, therefore, to provide an improvement in opto-electronic devices.

It is a further object of the invention to provide an improvement in strain layer quantum-well semiconductor heterostructures.

It is another object of the invention to effect heavy- and light-hole bands such that they are tunable and can be crossed over in a semiconductor quantum well device by appling a voltage as opposed to inducing a uniaxial stress.

It is yet a further object of the invention to tune the heavy hole confined level of a strain layer quantum well semiconductor heterostructure from below to above the light hole confined level in order to modulate the polarization and intensity of light passing therethrough by an applied bias voltage.

It is yet another object of the invention to provide a tunable optical waveguide polarizer and analyzer in the form of a strain layer quantum well heterostructure which is monolithically integratable in an original equipment integrated circuit device.

Briefly, the foregoing and other objects are achieved by an opto-electronic semiconductor device comprised of a variable strained layered quantum well structure including at least two superimposed heavy- and light-hole triangular bottom quantum wells having mutually opposite slopes and means for applying a bias potential across a thickness dimension of the quantum wells and generating an electric field therethrough as well as quantum confined Stark shifts for the heavy- and light-hole bands which generates an interchange of the confined energy levels of heavy holes and light holes in the quantum wells which causes a change in the transmission characteristics of light passing through the device as a result of the heavy and light hole energy bands having different anisotropy in light absorption.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION OF THE INVENTION

This invention concerns a variable strain layered composition of a semiconductor quantum well which utilizes a plurality of lattice mismatched Group III-V or Group II-VI materials such that one side or end of the well is under a tensile strain, while the other side or end is under a less tensile strain (or non-strain) or a compressive strain. The tensile strain decreases and becomes a compressive strain toward the other well interface.

Figure 1:
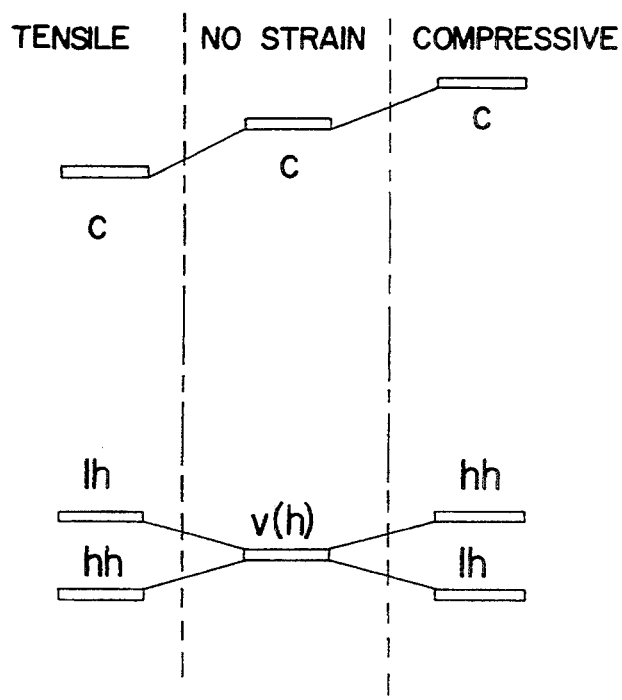
FIG. 1 is a diagram of the conduction energy band level heavy- and light-hole valence and band edges respectively of a semiconductor under biaxial compression strain, tensile strian, or non-strain.
Figure 2:
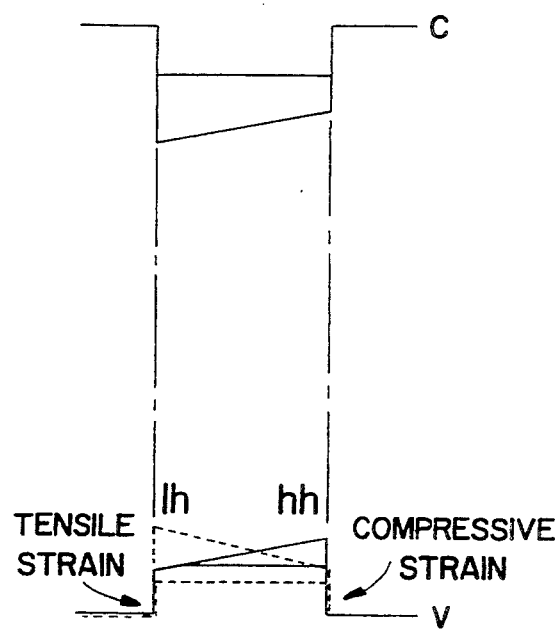
FIG. 2 is a diagram of the energy band level and band edges respectively of a variable strained quantum well structure in accordance with the subject invention.

According to semiconductor strain theories, the tensile strength splits the light-hole energy band above the heavy-hole band, which is shown in FIG. 1. In accordance with a preferred embodiment of the subject invention, at least two superimposed heavy- and light-hole triangle bottom quantum wells are included in a multiple quantum well structure such that the heavy hole well has an opposite slope relative to that of the light hole well. This results in an energy band level and band edge diagram as shown in FIG. 2. The invention requires the application of an external bias voltage across the quantum wells for generating an electric field in the growth direction. Excitons in one triangular bottom valance well, which has a slope in the same direction as the electric field will have a relatively strong quantum confined Stark effect which will shift the confined levels to lower energy levels. On the other hand, excitons in the other opposite triangular bottom well will have no effect or an opposite effects and its confined energy will stay or shift to a higher energy level. Therefore, the applied bias voltage causes an interchange of the heavy- and light-hole confined energy levels. Since heavy- and light-hole bands have different anisotropy in absorption, interchange of the heavy and light-hole bands provides a change in polarization or intensity of light passing through the device.

Figure 3:
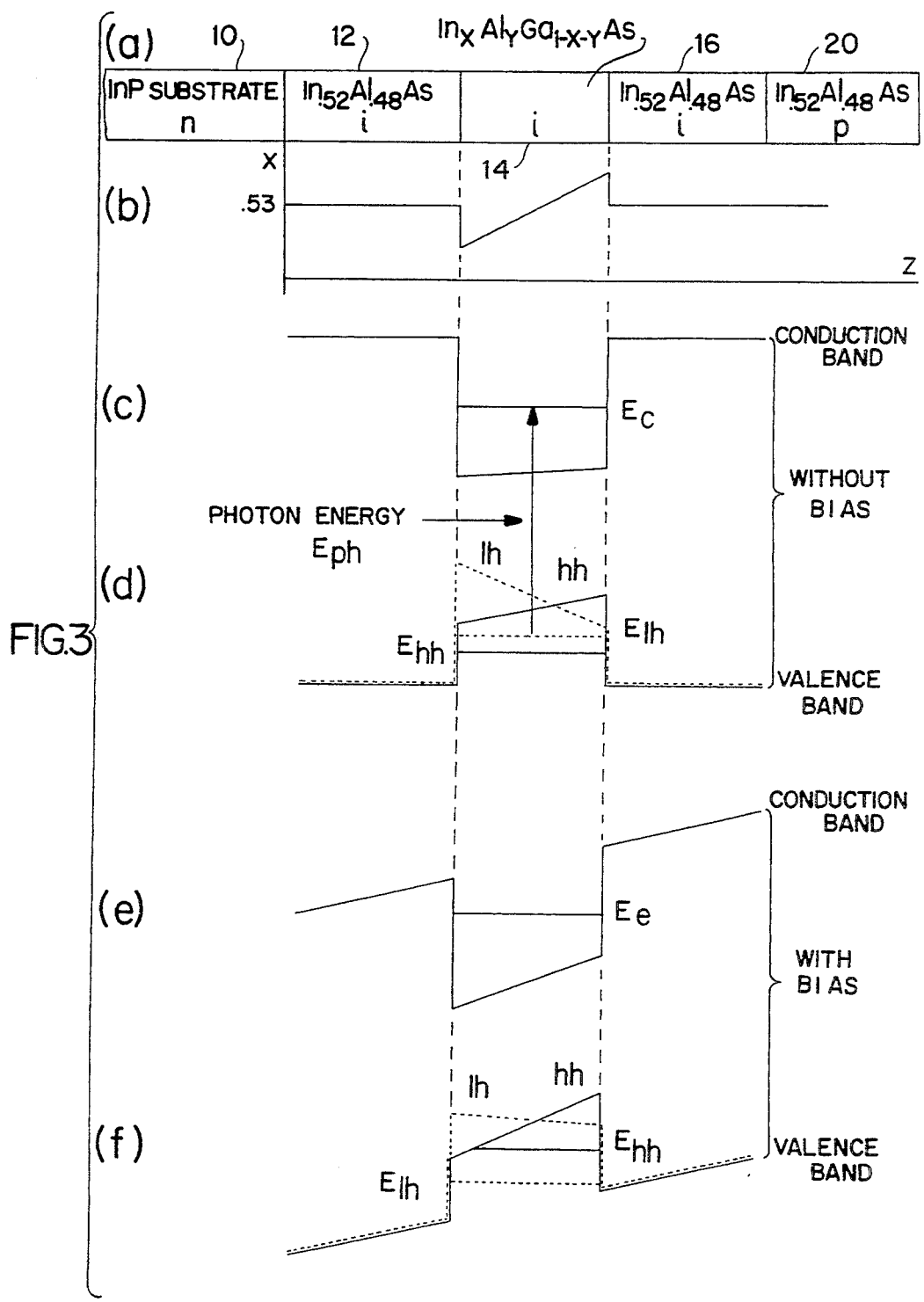
FIG. 3(a) is a schematic diagram of one example of the preferred embodiment of the invention.
FIG. 3(b) is a diagram illustrative of the mole fraction change in In of the quantum well included in the structure shown in FIG. 3(a)
FIG. 3(c) is a diagram of the electron energy level and the conduction band edges of the quantum well structure of FIG. 3(a) without bias.
FIG. 3(d) is a diagram of the heavy- and light-hole bands of the quantum well structure of FIG. 3(a) without bias.
FIG. 3(e) is a diagram of the electron energy level and band edges of the quantum well structure included in the quantum well of FIG. 3(a) with an applied bias.
FIG. 3(f) is a diagram of the heavy- and light-holes of the quantum well structure of FIG. 3(a) with an applied bias.

The preferred embodiment of the invention comprises a molecular beam epitaxy (MBE) grown InAlAs/InAlGaAs/InAlAs/InP structure which is shown schematically in FIG. 3(a). Referring now to FIG. 3(a), reference numeral 10 denotes a small n-type InP substrate on which is grown an n-type (or p-type) $In_{0.52}Al_{0.48}As$ cladding layer and a barrier layer of undoped $In_{0.52}Al_{0.48}As$. Over the barrier layer 12 is grown a variable strain layered multiple quantum well structure 14 comprised of undoped $In_xAl_yGa_{1-x-y}As$. On top of the quantum well structure 14 there is grown a second barrier layer 16 also comprised of undoped $In_{0.52}Al_{0.48}As$. The barrier layer 16 is followed by a growth of a cladding layer comprised of p-type (or n-type) $In_{0.52}Al_{0.48}As$.

The quantum well structure 14 comprises a pseudomorphic strained quantum well having a gradient in the In and Al mole fractions as shown in FIG. 3(b) where the In fraction x changes gradually from a value above 0.53, such as 0.55, at one side adjacent the upper barrier layer 16 to another value below 0.53, such as 0.35, at the other side adjacent the lower barrier layer 12 so that one side of the quantum well structure 14 is under compressive strain. The compression strain is gradually reduced becoming tensile strained toward the other side.

The variation of the Al mole fraction y in the quantum well structure 14 is used to compensate the band gap variation made in the In fraction so that the bottom of the wells (for heavy- and light-hole and the electron) are substantially linear, which may or may not be needed. The overall In and Al fractions as a function of z along the z axis, as shown in FIG. 3(b), and the well width is determined from a calculation so that without a bias, the energy difference between the first light-hole subband and the first electron subband is equal to or slightly less than the energy of the incident light, i.e. $E_e - E_{lh} \leq E_{ph}$, where $E_e$ is the electron energy, $E_{lh}$ is the light hole energy and $E_{ph}$ is the photon energy, but the energy difference between the first heavy-hole subband and the first electron subband is larger than the photon energy, i.e. $E_e - E_{hh} \geq E_{ph}$. Accordingly, only light-hole band absorption takes place. This is shown by the energy diagrams of FIGS. 3(c) and 3(d).

Now as shown in FIGS. 3(e) and 3(f), when an external bias voltage is applied, the generated electric field follows the heavy-hole band and the quantum Stark effects shift the heavy-hole transition to the lower energy side and the light-hole state becomes under the opposite effects so that the heavy- and light-hole band levels cross over one another so that only heavy-hole band absorption can take place.

Although not shown, a third condition can be implemented wherein an intermediate bias is applied, making both heavy- and light-hole to electron interband transition energies larger than the photon energy so that the absorption is negligible.

Figure 4:
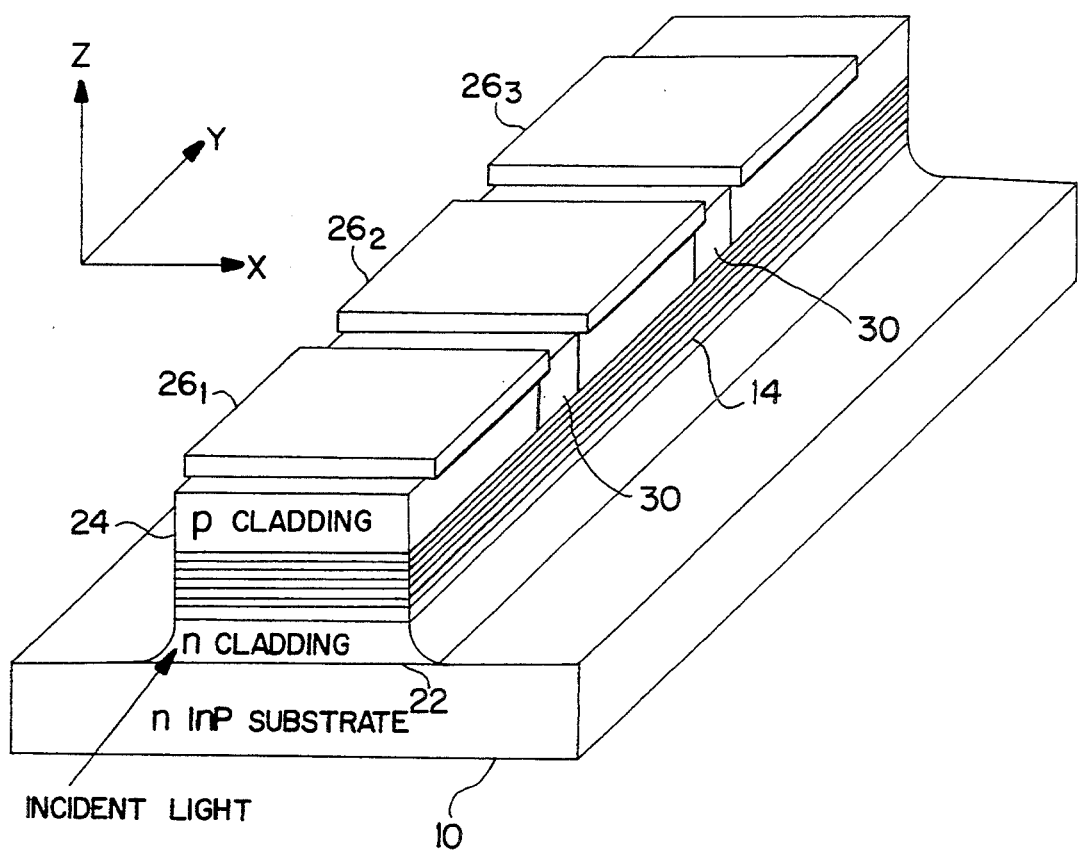
FIG. 4 is a perspective view of a rib type optical waveguide including an embodiment of the invention.

Such an asymmetric variable strain layer quantum semiconductor well heterostructure has many applications, one embodiment of which is shown in FIG. 4. Referring now to FIG. 4, shown thereat is a rib type optical waveguide 20 which can be made by chemically etching a strain layered heterostructure including a multiple variable strain quantum well structure 14 sandwiched between a bottom n-type cladding layer 22 and a top p-type cladding layer 24. Although not shown, barrier layers 12 and 16 such as shown in FIG. 3(a) are also included between the cladding layers 22 and 24, with the whole structure being fabricated on an InP substrate 10.

A plurality of metal caps shown by reference numerals $26_1$, $26_2$, $26_3$ which act as contacts, are fabricated in the form of mesas fabricated on top of the cladding layer 24. The contacts $26_1$, $26_2$ and $26_3$ are spaced apart and isolation therebetween is made by ion implementation, represented by H+implant regions 30, in order to construct a series of independent diodes.

With light applied and propagating in the Y axis direction, the heavy-hole energy band absorbs only light with X-polarization, while the light-hole energy band absorbs light with both X and Z-polarizations, but at different rates. Since absorption is linear dependent on the length of the device 20 and the applied bias, controlling the bias voltage applied to each metal contact $26_1$, $26_2$ and $26_3$, controls the polarization from 0° to 90° in the X-Z plane so that a waveguide polarizer is provided in each section which only transmits light with a chosen or predetermined linear polarization. If the incident light is linearly polarized, except in the X axis direction, the device then operates as an analyzer.

Devices with two or more of these diode sections $26_1$, $26_2$ or $26_3$, such as hereinabove described, can have a significant impact on opto-electronic integrated devices and opens a new chapter for photonic information processing because they allow an optical signal to be processed at many polarization degrees rather than just with on and off states. Using such devices can result in the construction of optical switches and optical logic circuits, to name a few. Another application is to make a waveguide optical intensity modulator. The existing Stark effect quantum well modulators, while having the advantage of high speed, have relatively low contrast ratio. With a modulator constructed in accordance with the principles of the subject invention, the Stark effect combined with heavy- and light-hole coupling will result in much higher contrast ratios due to its high tunability, thus preserving high speed.

Thus what has been shown and described is a semiconductor device having tunable heavy- and light-hole levels which can cross over each other by an applied bias voltage which effect was previously accomplished by applied mechanical uniaxial stress.

Having thus shown and described what is at present considered to be the preferred embodiments of the invention, it should be noted that the same has been made by way of illustration and not limitation. Accordingly, all modifications, alterations and changes coming within the spirit and scope of the invention as set forth in the appended claims are herein meant to be included.

What is claimed is:

1. An opto-electronic semiconductor device comprising:
    a variable strained layered quantum well structure including at least two superimposed valance-band heavy- and light-hole triangular bottom quantum wells having mutually opposite slopes; and
    means for applying a bias potential across a thickness dimension of said quantum wells and generating an electric field therethrough,
    whereby the confined energy levels of heavy-holes and light-holes in said quantum wells are interchanged so as to cause a change in transmission characteristics of light passing through said device as a result of the heavy- and light-hole energy bands having different anisotropy in light absorption.

2. The opto-electronic semiconductor device according to claim 1 wherein said quantum wells are comprised of a plurality of mismatched lattices of Group III-V or Group II-VI semiconductor material.

3. The opto-electronic semiconductor device according to claim 1 wherein quantum well structure comprises a plurality of quantum well layers of InAlGaAs.

4. The opto-electronic semiconductor device according to claim 3 and additionally including a substrate and barrier layers of InAlAs which are lattice matched to the substrate.

5. The opto-electronic semiconductor device according to claim 4 wherein said substrate comprises an InP substrate.

6. The opto-electronic semiconductor device according to claim 1 wherein said quantum well structure comprises a pseudomorphic strained layer multiple quantum well structure consisting of $In_xAl_yGa_{1-x-y}$ and wherein the mole fractions of In and Al have a gradient therein.

7. The opto-electronic semiconductor device according to claim 6 wherein the mole fraction x of In changes relatively gradually above and below a median value to first and second predetermined end values.

8. The opto-electronic semiconductor device according to claim 7 wherein said median value of x is approximately 0.50.

9. The opto-electronic semiconductor device according to claim 8 wherein said first and second end values are approximately 0.55 and 0.35, respectively.

10. The otpo-electronic semiconductor device according to claim 6 wherein the mole fraction y of Al is selected to compensate for the band gap variation generated by the In mole fraction so that the bottom of said wells are substantially linear.

11. The opto-electronic semiconductor device according to claim 6 wherein said quantum well is sandwiched between $In_xAl_{1-x}As$ barriers which are lattice matched with a semiconductor substrate.

12. The opto-electronic semiconductor device according to claim 11 wherein x of said $In_xAl_{1-x}$ barriers are mole fractions having a value of x=0.52.

13. The opto-electronic semiconductor device according to claim 11 wherein said substrate comprises InP.

14. The opto-electronic semiconductor device according to claim 12 wherein the device is sandwiched between n-type and p-type cladding layers.

15. The opto-electronic semiconductor device according to claim 14 wherein the cladding layers are comprised of $In_{0.52}Al_{0.48}As$.

* * * * *